(12) United States Patent
Dakshina-Murthy et al.

(10) Patent No.: US 6,406,993 B1
(45) Date of Patent: Jun. 18, 2002

(54) METHOD OF DEFINING SMALL OPENINGS IN DIELECTRIC LAYERS

(75) Inventors: Srikanteswara Dakshina-Murthy; Paul R. Besser, both of Austin, TX (US); Jonathan B. Smith, Fremont, CA (US); Eric M. Apelgren, Austin, TX (US); Christian Zistl, Dresden (DE); Jeremy I. Martin; Lie Larry Zhao, both of Austin, TX (US); Nicholas J. Kepler, Saratoga, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 35 days.

(21) Appl. No.: 09/523,439

(22) Filed: Mar. 10, 2000

(51) Int. Cl.$^7$ .......................................... H01L 21/4763
(52) U.S. Cl. ..................... 438/624; 438/618; 438/622; 438/623; 438/637; 438/638; 438/639; 438/666
(58) Field of Search ................................. 438/618, 622, 438/623, 624, 637, 638, 639, 666

(56) References Cited

U.S. PATENT DOCUMENTS

| 6,074,955 A | * | 6/2000 | Lin et al. ..................... 438/710 |
| 6,107,189 A | * | 8/2000 | Wald et al. .................. 438/637 |

* cited by examiner

*Primary Examiner*—John F. Niebling
*Assistant Examiner*—David A. Zarneke
(74) *Attorney, Agent, or Firm*—Williams, Morgan & Amerson, P.C.

(57) ABSTRACT

The present invention is directed to a method of forming semiconductor devices. In one illustrative embodiment, the method comprises forming a layer of dielectric material, forming a hard mask layer above the layer of dielectric material, and forming an opening in the hard mask layer. The method further comprises forming a sidewall spacer in the opening in the hard mask layer that defines a reduced opening, forming an opening in the layer of dielectric material below the reduced opening, and forming a conductive interconnection in the opening in the dielectric layer.

28 Claims, 4 Drawing Sheets

METHOD OF DEFINING SMALL OPENINGS IN DIELECTRIC LAYERS

BACKGROUND OF THE INVENTION

1. Field of the Invention

The present invention is generally directed to semiconductor processing, and, more particularly, to a method for forming openings in a dielectric layer for conductive interconnections.

2. Description of the Related Art

There is a constant drive to reduce the channel length of transistors to increase the overall speed of the transistor, as well as integrated circuit devices incorporating such transistors. A conventional integrated circuit device, such as a microprocessor, is typically comprised of many thousands of semiconductor devices, e.g., transistors, formed above the surface of a semiconducting substrate. For the integrated circuit device to function, the transistors must be electrically connected to one another through conductive interconnections.

Many modern integrated circuit devices are very densely packed, ie., there is very little space between the transistors formed above the substrate. Thus, these conductive interconnections must be made in multiple layers to conserve plot space on the semiconducting substrate. This is typically accomplished through the formation of a plurality of conductive lines and conductive plugs formed in alternative layers of dielectric materials formed on the device. The conductive plugs are means by which various layers of conductive lines, and/or semiconductor devices, may be electrically coupled to one another. The conductive lines and plugs may be made of a variety of conductive materials, such as copper, aluminum, aluminum alloys, titanium, tantalum, titanium nitride, tantalum nitride, tungsten, etc.

As stated previously, an integrated circuit device is comprised of many thousands of transistors. An illustrative transistor 10 that may be included in such an integrated circuit device is shown in FIG. 1. The transistor 10 is generally comprised of a gate dielectric 14, a gate conductor 16, and a plurality of source/drain regions 18 formed in a semiconducting substrate 12. The gate dielectric 14 may be formed from a variety of dielectric materials, such as silicon dioxide. The gate conductor 16 may also be formed from a variety of materials, such as polysilicon. The source and drain regions 18 may be formed by one or more ion implantation processes in which a dopant material is implanted into the substrate 12.

Next, a first dielectric layer 26 is formed above the transistor 10, and a plurality of vias or openings 24 are formed in the first dielectric layer 26. Thereafter, the vias 24 are filled with a conductive material, such as a metal, to form contacts 22. In the illustrative transistor 10 shown in FIG. 1, the contacts 22 are electrically coupled to the source and drain regions 18 of the transistor 10. Thereafter, a second dielectric layer 32 may be formed above the first dielectric layer 26. Multiple openings 30 may be formed in the second dielectric layer 32, and the openings 30 may thereafter be filled with a conductive material to form conductive lines 28. Although only a single level of contacts and a single level of conductive lines are depicted in FIG. 1, there may be multiple levels of contacts and lines interleaved with one another. This interconnected network of contacts and lines allows electrical signals to propagate throughout the integrated circuit device. The techniques used for forming the various components depicted in FIG. 1 are known to those skilled in the art and will not be repeated here in any detail.

In general, the various features of a semiconductor device, e.g., the gate electrode and the conductive interconnections of a typical field-effect transistor, are manufactured by a continual process of forming various layers of material, selectively removing, or patterning, portions of those layers, and, in some cases, forming additional layers of materials in opening defined in the layers. For example, to form a gate electrode of an illustrative field-effect transistor, a layer of material, such as polysilicon, may be deposited above a surface of a semiconducting substrate. Thereafter, portions of the polysilicon layer are removed, leaving what will become the gate electrode in place above the semiconducting substrate, i.e., the polysilicon layer is patterned to define a gate electrode.

The patterning of these various process layers is typically accomplished using known photolithography and etching process. In general, photolithography is a process in which a layer of photoresist, a material whose structure may be changed upon exposure to a light source, is formed above a process layer in which it is desired to form a feature of a semiconductor device. Essentially, the image that is desired to ultimately be formed in the underlying process layer will first be formed in the layer of photoresist by exposing portions of the photoresist layer to an appropriate light source. Following development of the photoresist layer, the remaining portions of the photoresist layer will be resistant to subsequent etching processes to be performed on the semiconductor device. The desired features of the semiconductor device are then formed in the underlying process layer by performing one or more wet or dry etching processes to remove the portions of underlying process layer that are not protected by the feature defined in the layer of photoresist.

However, as semiconductor feature sizes continue to decrease, it is desirable to form feature sizes to dimensions that are less than can be directly defined by standard photolithographic processes. In particular, due to the continual trend to produce more densely-packed integrated circuit devices, it is desirable to be able to form conductive interconnections to sizes smaller than can be achieved with traditional photolithographic techniques.

The present invention is directed to a method of making a semiconductor device that minimizes or reduces some or all of the aforementioned problems.

SUMMARY OF THE INVENTION

The present invention is directed to a method of forming semiconductor devices. In one illustrative embodiment, the method comprises forming a layer of dielectric material, forming a hard mask layer above the layer of dielectric material, and forming an opening in the hard mask layer. The method further comprises forming a sidewall spacer in the opening in the hard mask layer that defines a reduced opening, forming an opening in the layer of dielectric material below the reduced opening, and forming a conductive interconnection in the opening in the dielectric layer.

BRIEF DESCRIPTION OF THE DRAWINGS

The invention may be understood by reference to the following description taken in conjunction with the accompanying drawings, in which like reference numerals identify like elements, and in which.

Figure 1:
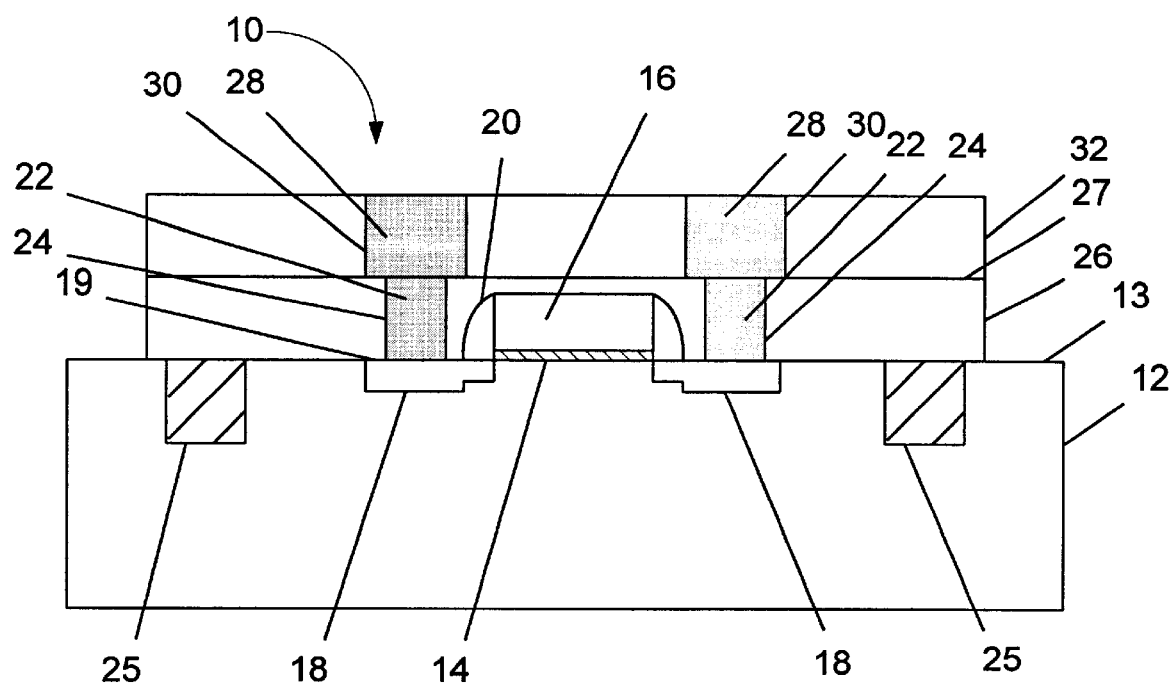
FIG. 1 is a cross-sectional view of an illustrative prior art semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–8. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming openings for conductive interconnections in a dielectric layer in a semiconductor device. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Figure 2:
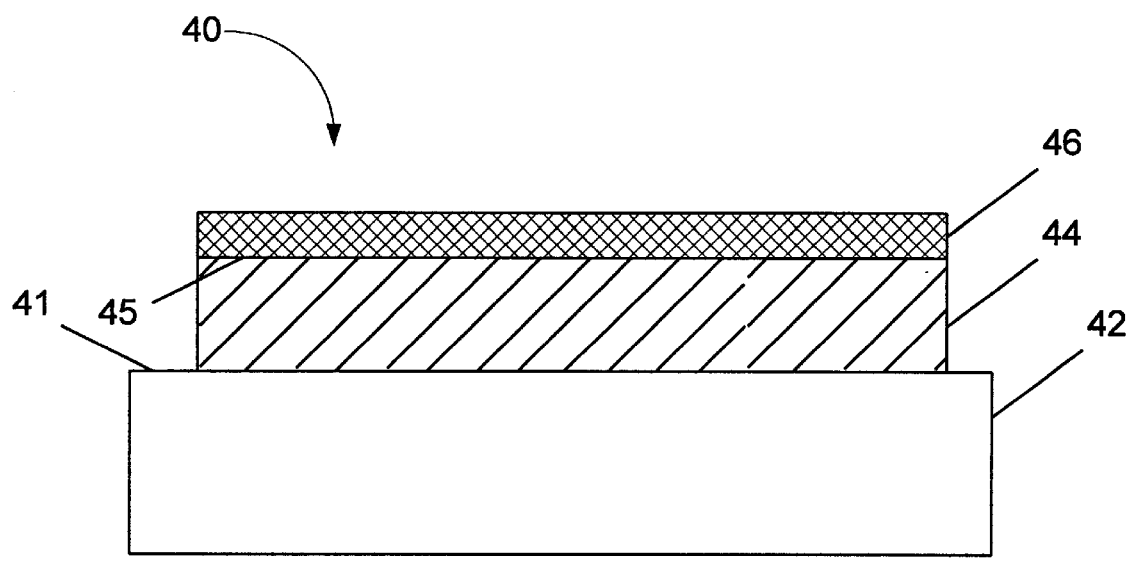
FIG. 2 is a cross-sectional view of a partially formed semiconductor device in accordance with one illustrative embodiment of the present invention.

As shown in FIG. 2, in one illustrative embodiment, a partially formed interconnect structure 40 is comprised of a layer of dielectric material 44 formed above a surface 41 of a structure 42, and a hard mask layer 46 formed above the layer of dielectric material 44. The structure 42 may be any type of structure found in semiconductor processing operations. The structure 42 may be comprised of a partially formed integrated circuit device (not shown in FIG. 2), or it may be a previous metallization layer formed on an integrated circuit device. For example, the structure 42 may be comprised of all the components of the transistor 10 depicted in FIG. 1 that lie in or below the process layer 26. Alternatively, the structure 42 may be comprised of a metallization layer, such as the components depicted in the process layer 32 in FIG. 1.

The dielectric layer 44 may be comprised of any material having a relatively low dielectric constant ("k") that is suitable for use as an insulating layer between conductive interconnections formed on an integrated circuit device, e.g., a material having a dielectric constant less than approximately five. For example, the dielectric layer 44 may be comprised of any dielectric material, e.g., silicon dioxide, fluorinated TEOS, carbon-doped oxide, hydrogen silsesquioxane, etc. The dielectric layer 44 may be formed by a variety of known techniques for forming such layers, e.g., physical vapor deposition ("PVD"), chemical vapor deposition ("CVD"), plasma enhanced chemical vapor deposition ("PECVD"), sputtering, thermal growing, etc., and it may have a thickness ranging from approximately 3000–5000 Å. In one illustrative embodiment, the dielectric layer 44 is comprised of a deposited layer of silicon dioxide having a thickness ranging from approximately 3000–5000 Å.

In one illustrative embodiment of the present invention, a hard mask layer 46 may be formed above the dielectric layer 44. The hard mask layer 46 may be comprised of a variety of materials, e.g., silicon nitride, silicon oxynitride, silicon dioxide, etc. In general, the material comprising the dielectric layer 44 should be selectively etchable with respect to the material that comprises the hard mask layer 46. The hard mask layer 46 may be formed by a variety of known techniques for forming such layers, e.g., physical vapor deposition ("PVD"), chemical vapor deposition ("CVD"), sputtering, etc., and it may have a thickness ranging from approximately 500–2000 Å. In one illustrative embodiment, the hard mask layer 46 is comprised of a deposited layer of silicon nitride having a thickness ranging from approximately 500–2000 Å.

Figure 3:
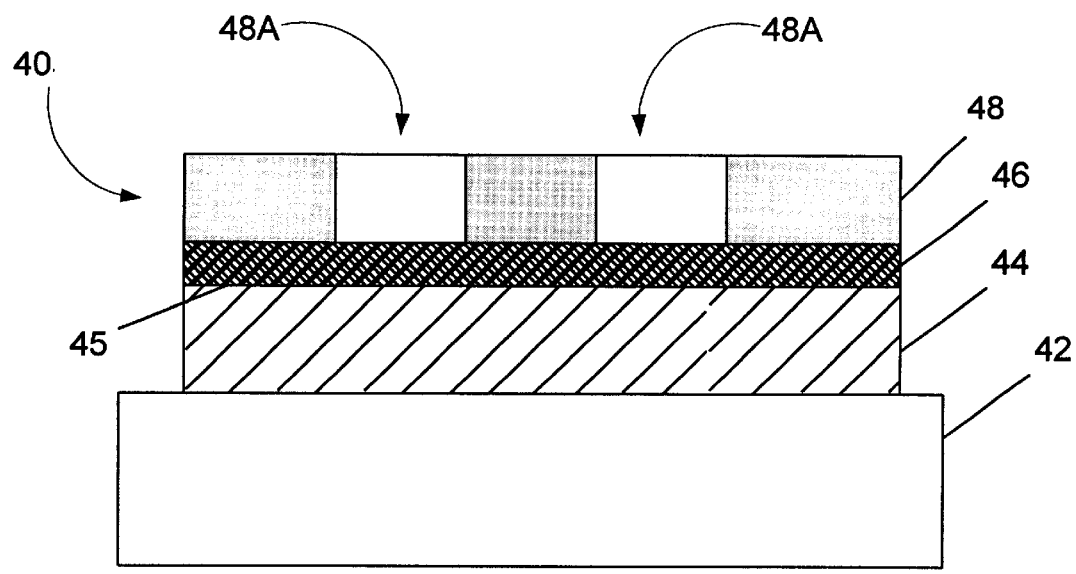
FIG. 3 is a cross-sectional view of the device depicted in FIG. 2 after a layer of photoresist has been formed and patterned thereabove.

Next, as shown in FIG. 3, a layer of photoresist 48 is formed above a surface 47 of the hard mask layer 46 and patterned using traditional photolithography processes to result in a plurality of openings 48A in the layer of photoresist 48. The layer of photoresist 48 may be formed by a variety of techniques, e.g., spin-coating the photoresist on the surface of the wafer. The thickness of the layer of photoresist may range from approximately 4000–6000 Å. Although the openings 48A depicted in FIG. 3 have a circular cross-section, the layer of photoresist 48 may be patterned to defined openings 48A that may be any size, shape or configuration, depending upon the particular feature to be defined in the underlying dielectric layer 44. In one illustrative embodiment where it is desired to form holes in the dielectric layer 44 for conductive plugs, the openings 48A have a circular cross-section. For situations in which it is desired to define metal lines in the underlying dielectric layer 44, the openings 48A would be essentially elongated rectangular shapes patterned across the surface of the wafer.

Figure 4:
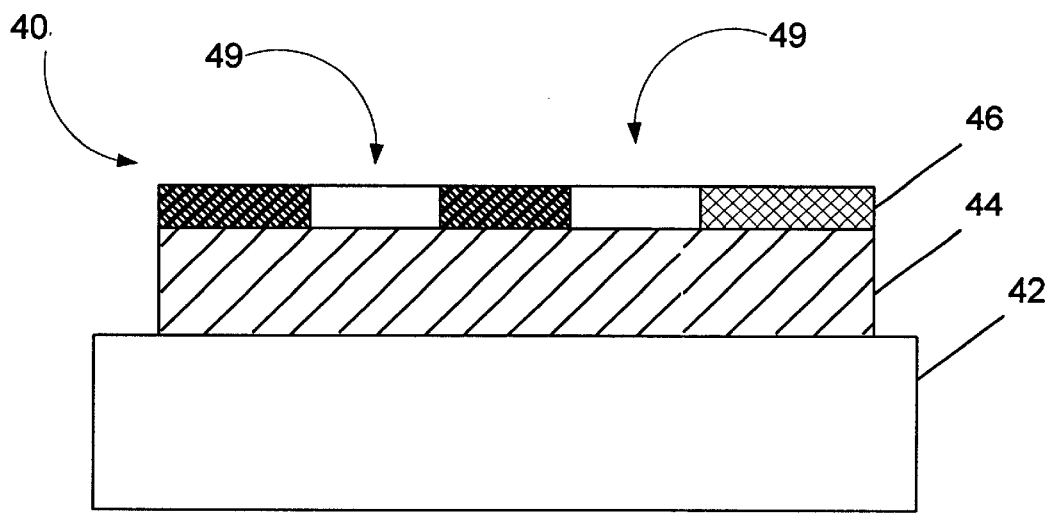
FIG. 4 is a cross-sectional view of the device depicted in FIG. 3 after the hard mask layer has been patterned.

Next, as shown in FIG. 4, the hard mask layer 46 is patterned using one or more etching processes to result in a plurality of openings 49 formed in the hard mask layer 46. In the illustrative embodiment depicted in FIGS. 3 and 4, the openings 48A in the layer of photoresist 48 correspond to the openings to be formed in the dielectric layer 44. Thereafter, the patterned photoresist layer 48 shown in FIG. 3 may be removed by standard techniques, such as plasma ash, solvent strip or piranha clean.

Figure 5:
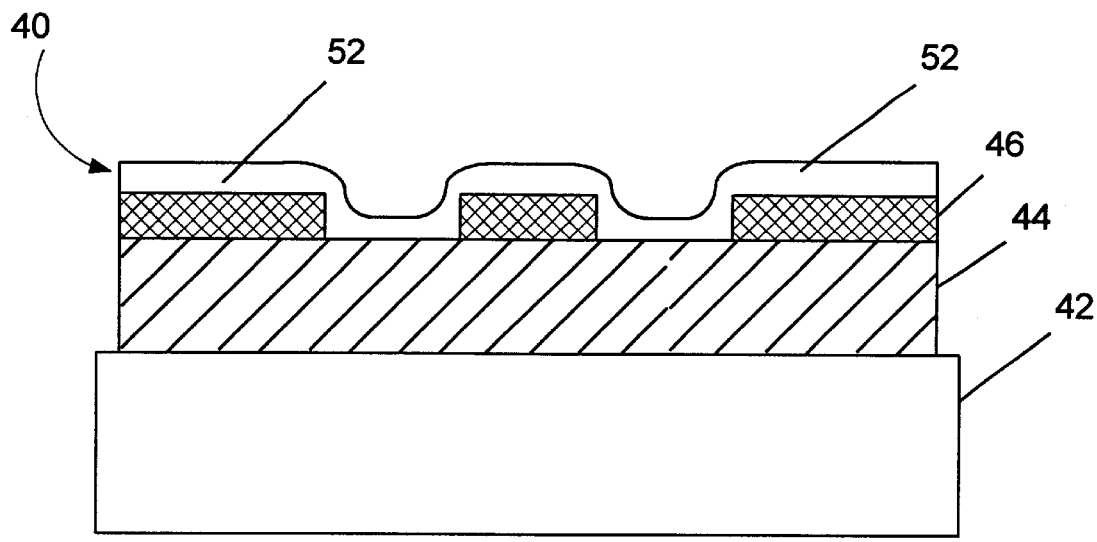
FIG. 5 is a cross-sectional view of the device depicted in FIG. 4 after a process layer has been formed above the device.

Next, as shown in FIG. 5, a process layer 52 is formed above the patterned hard mask layer 46 and in the openings 49 formed in the patterned hard mask layer 46. The process layer 52 may be comprised of a variety of materials, e.g., silicon nitride, silicon oxynitride, silicon dioxide, etc. In general, the dielectric layer 44 should be selectively etchable with respect to the material comprising the process layer 52. The process layer 52 may be formed by a variety of techniques for forming such layers, e.g., CVD, PECVD, PVD, etc., and it may have a thickness ranging from approximately 500–1000 Å. The process layer 52 may have a thickness that is comparable to the thickness of the hard mask layer 46. Additionally, the thickness of the process layer 52 may be varied based upon the desired final thickness of a sidewall spacer 53 (see FIG. 4) to be formed in the openings 49. In one illustrative embodiment, the process layer 52 is comprised of a deposited layer of silicon nitride having a thickness ranging from approximately 500–1000 Å.

Figure 6:
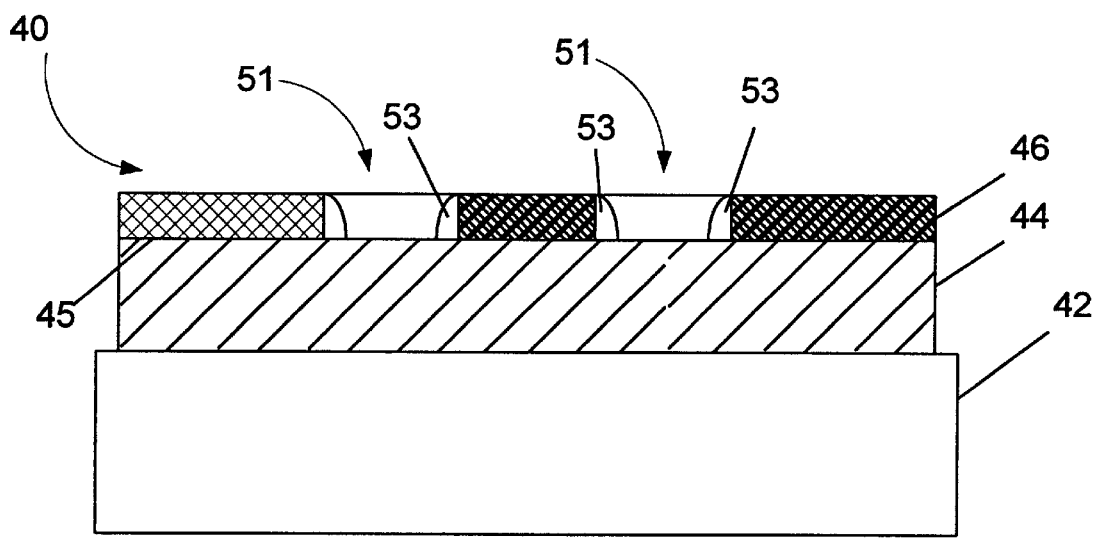
FIG. 6 is a cross-sectional view of the device depicted in FIG. 5 after a plurality of sidewall spacers have been formed adjacent the features in the patterned hard mask layer.

Thereafter, as shown in FIG. 6, a sidewall spacer 53 is formed in the openings 49. The sidewall spacer 53 may be formed by a variety of techniques, such as by forming the process layer 52, comprised of the appropriate spacer material, above the patterned hard mask layer 46 and in the openings 49, and, thereafter, performing an anisotropic etching process on the process layer 52 to define the sidewall spacer 53. The thickness of the sidewall spacer 53, as measured at the point where it intersects the surface 45 of the dielectric layer 44, may vary as a matter of design choice. In one illustrative embodiment, the process layer 52 is comprised of a deposited layer of silicon nitride having a thickness ranging from approximately 500–1000 Å. The resulting sidewall spacer 53 may have a thickness ranging from approximately 400–800 Å, depending upon the degree of anisotropy of the spacer etch process. The sidewall spacer 53 defines a reduced opening 51 that is of a lesser size than that of the openings 49 formed in the hard mask layer 46. Note that, although only a single spacer 53 is formed in the opening 49, if desired, multiple spacers could be formed in the opening 49. In that situation, the innermost spacer would define the reduced opening 51.

The dimension of the openings 49 formed in the hard mask layer 46 may be as small as that which may be directly patterned using known photolithography and etching processes, although that is not required to practice the present invention. Through use of the present invention, the opening 51 defined by the sidewall spacer 53 may be used to define a feature size, e.g., a conductive plug, that is less than that which may be directly defined using traditional photolithography and etching processes. However, the present invention may be used to define features much larger than that if desired. For example, in one illustrative embodiment, the openings 49 in the hard mask layer 46 may have a diameter of approximately 3000 Å, and the sidewall spacer 53 has a thickness of approximately 600 Å. The resulting feature size defined by the opening 51 between the sidewall spacers 53 may be approximately 1800 Å, or 0.18 microns.

Figure 7:
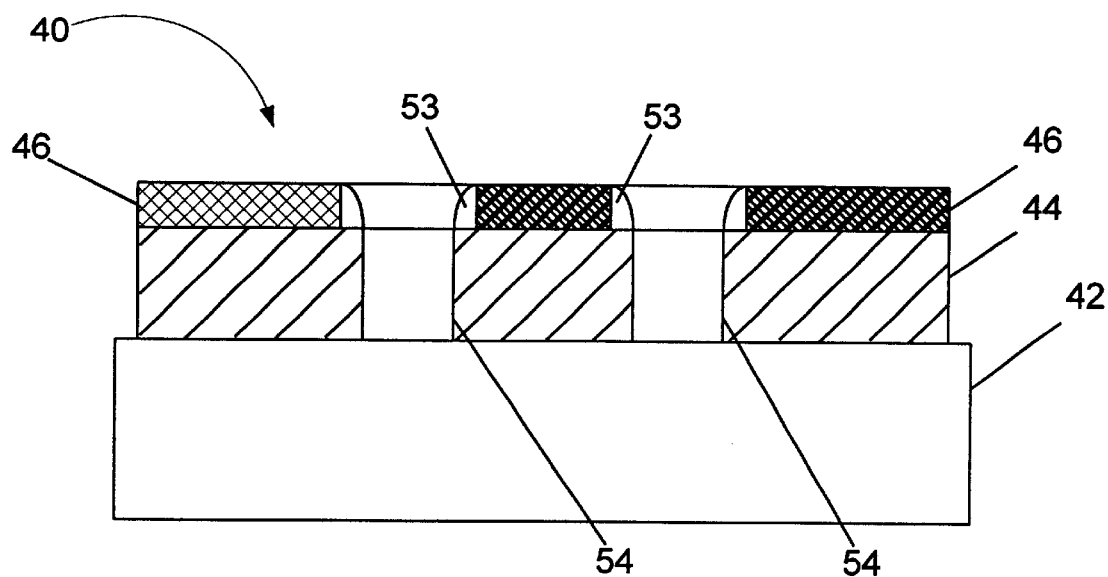
FIG. 7 is a cross-sectional view of the device depicted in FIG. 6 after a plurality of openings have been defined in an underlying dielectric layer.
Figure 8:
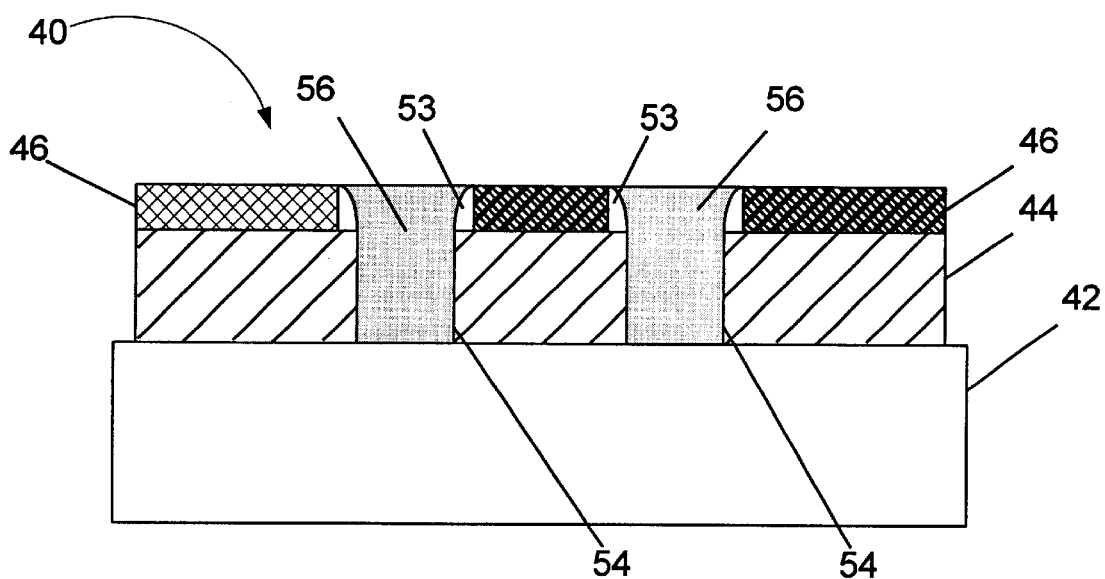
FIG. 8 is a cross-sectional view of the device depicted in FIG. 7 after a plurality of conductive interconnections have been formed in the openings in the underlying dielectric layer.

Thereafter, as shown in FIG. 7, a plurality of openings 54 may be formed in the layer of dielectric material 44 by performing one or more traditional etching operations. This is possible due to etch selectivity between both the hard mask layer 46 and the sidewall spacers 53 and the material comprising the dielectric layer 44. Note that, the openings 54 are formed under the openings 51 defined by the sidewall spacers 53. Thereafter, as shown in FIG. 8, a conductive material, such as a metal; e.g., aluminum, copper, tungsten, etc., is formed in the openings 54 to form a conductive interconnection 56, along which signals will propagate throughout the integrated circuit device. The conductive interconnections 56 may be formed by depositing a layer of the appropriate material, and, thereafter, performing a planarization operation. Although the conductive interconnection 56 has been depicted in the drawings as a conductive plug, the conductive interconnection 56 may take any form or shape, e.g., a plug, a line, a composite of both, etc. Thus, the particular size, configuration, and materials of construction of the conductive interconnection 56 should not be considered a limitation of the present invention.

Moreover, the hard mask layer 46 and the sidewall spacer 53 may be made from the same or different materials. For example, the hard mask layer 46 and the sidewall spacer 53 may both be made of silicon nitride. In one illustrative embodiment of the present invention, the layer of dielectric material 44 may be comprised of silicon dioxide and the hard mask layer 46 and sidewall spacer 53 may both be comprised of silicon nitride. In another illustrative embodiment of the present invention, the layer of dielectric material 44 may be comprised of hydrogen silsesquioxane, and the hard mask layer 46 and sidewall spacer 53 may be formed of silicon dioxide. In yet another illustrative example, the layer of dielectric material 44 may be comprised of hydrogen silsesquioxane, the hard mask layer 46 may be comprised of silicon dioxide, and the sidewall spacer 53 may be comprised of silicon nitride. Of course, other material combinations are possible and, thus, should not be considered a limitation of the present invention unless specifically recited in the appended claims.

Through use of the present invention, openings for conductive interconnections in dielectric layers may be formed smaller than traditional photolithography equipment and processes will allow. That is, through use of the present invention, conductive interconnections may be formed in openings in dielectric layers in areas that are defined by the opening 51 between the sidewall spacers 53 described above. This, therefore, enables the formation of smaller interconnect metal vias and metal lines than is possible under current photolithographic constraints. Moreover, the present invention may be employed even as current photolithography processing equipment and techniques are improved so as to enable the definition of smaller and smaller feature sizes for generations of integrated circuit devices to come.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a layer of dielectric material, said layer of dielectric material having an upper surface;

forming a hard mask layer on said upper surface of said layer of dielectric material, said hard mask layer having a thickness;

forming an opening in said hard mask layer to thereby expose a portion of said upper surface of said layer of dielectric material;

forming a sidewall spacer in said opening above said exposed upper surface of said layer of dielectric material, said sidewall spacer defining a reduced opening and having a thickness corresponding to said thickness of said hard mask layer;

forming an opening in said layer of dielectric material below said reduced opening; and forming a conductive interconnection in said opening in said layer of dielectric material.

2. The method of claim 1, wherein forming a layer of dielectric material comprises depositing a layer of dielectric material.

3. The method of claim 1, wherein forming a layer of dielectric material comprises forming a layer of dielectric material having a dielectric constant less than approximately five.

4. The method of claim 1, wherein forming a layer of dielectric material comprises forming a layer of dielectric material comprised of at least one of silicon dioxide, a carbon-based oxide, and hydrogen silsesquioxane.

5. The method of claim 1, wherein forming a hard mask layer above said layer of dielectric material comprises depositing a hard mask layer above said layer of dielectric material.

6. The method of claim 1, wherein forming a hard mask layer above said layer of dielectric material comprises forming a hard mask layer comprised of at least one of silicon nitride, silicon oxynitride, and silicon dioxide above said layer of dielectric material.

7. The method of claim 1, wherein forming an opening in said hard mask layer comprises etching an opening in said hard mask layer.

8. The method of claim 1, wherein forming a sidewall spacer in said opening, said sidewall spacer defining a reduced opening, comprises:

depositing a layer of material above said hard mask layer and in said opening; and performing an anisotropic etching process to define a sidewall spacer in said opening.

9. The method of claim 1, wherein forming an opening in said layer of dielectric material below said reduced opening comprises etching an opening in said layer of dielectric material below said reduced opening.

10. The method of claim 1, wherein forming a conductive interconnection in said opening in said layer of dielectric material comprises forming a conductive interconnection comprised of a metal in said opening in said layer of dielectric material.

11. The method of claim 1, wherein forming a conductive interconnection in said opening in said layer of dielectric material comprises forming a conductive interconnection comprised of at least one of copper, aluminum and tungsten in said opening in said layer of dielectric material.

12. The method of claim 1, wherein forming a conductive interconnection in said opening in said layer of dielectric material comprises depositing a metal in said opening in said layer of dielectric material and planarizing said metal.

13. A method, comprising:

forming a layer of dielectric material, said layer of dielectric material having an upper surface;

depositing a hard mask layer comprised of at least one of silicon nitride, silicon oxynitride, and silicon dioxide on said upper surface of said layer of dielectric material, said hard mask layer having a thickness;

etching an opening in said hard mask layer to thereby expose a portion of said upper surface of said layer of dielectric material;

forming a sidewall spacer in said opening above said exposed upper surface of said layer of dielectric material, said sidewall spacer defining a reduced opening and having a thickness corresponding to said thickness of said hard mask layer;

etching an opening in said layer of dielectric material below said reduced opening; and forming a conductive interconnection comprised of a metal in said opening in said layer of dielectric material.

14. The method of claim 13, wherein forming a layer of dielectric material comprises depositing a layer of dielectric material.

15. The method of claim 13, wherein forming a layer of dielectric material comprises forming a layer of dielectric material having a dielectric constant less than approximately five.

16. The method of claim 13, wherein forming a layer of dielectric material comprises forming a layer of dielectric material comprised of at least one of silicon dioxide, a carbon-based oxide, and hydrogen silsesquioxane.

17. The method of claim 13, wherein forming a hard mask layer comprised of at least one of silicon nitride, silicon oxynitride, and silicon dioxide above said layer of dielectric material comprises depositing a hard mask layer comprised of at least one of silicon nitride, silicon oxynitride, and silicon dioxide above said layer of dielectric material.

18. The method of claim 13, wherein forming a sidewall spacer in said opening, said sidewall spacer defining a reduced opening, comprises:

depositing a layer of material comprised of at least one of silicon nitride, silicon oxynitride, and silicon dioxide above said hard mask layer comprised of at least one of silicon nitride, silicon oxynitride, and silicon dioxide and in said opening; and performing an anisotropic etching process to defined a sidewall spacer in said opening.

19. The method of claim 13, wherein forming a conductive interconnection comprised of a metal in said opening in said layer of dielectric material comprises forming a conductive interconnection comprised of at least one of copper, aluminum and tungsten in said opening in said layer of dielectric material.

20. The method of claim 13, wherein forming a conductive interconnection comprised of a metal in said opening in said layer of dielectric material comprises depositing a metal in said opening in said layer of dielectric material and planarizing said metal.

21. A method, comprising:

depositing a layer of dielectric material, said layer of dielectric material having an upper surface;

depositing a hard mask layer comprised of silicon nitride on said upper surface of said layer of dielectric material, said hard mask layer having a thickness;

etching an opening in said hard mask layer to thereby expose a portion of said upper surface of said layer of dielectric material;

forming a sidewall spacer comprised of silicon nitride in said opening above said exposed upper surface of said layer of dielectric material, said sidewall spacer defining a reduced opening and having a thickness corresponding to said thickness of said hard mask layer;

etching an opening in said layer of dielectric material below said reduced opening; and forming a conductive interconnection comprised of a metal in said opening in said layer of dielectric material.

22. The method of claim 21, wherein depositing a layer of dielectric material comprises depositing a layer of dielectric material having a dielectric constant less than approximately five.

23. The method of claim 21, wherein depositing a layer of dielectric material comprises depositing a layer of dielectric material comprised of at least one of silicon dioxide, a carbon-based oxide, and hydrogen silsesquioxane.

24. The method of claim 21, wherein depositing a hard mask layer comprised of silicon nitride above said layer of dielectric material comprises depositing a hard mask layer comprised of silicon nitride above said layer of dielectric material, said hard mask layer having a thickness ranging from approximately 500–2000 Å.

25. The method of claim 21, wherein forming a sidewall spacer in said opening, said sidewall spacer defining a reduced opening, comprises:

depositing a layer of silicon nitride above said hard mask layer and in said opening; and performing an anisotropic etching process to define a sidewall spacer comprised of silicon nitride in said opening.

26. The method of claim 21, wherein forming a conductive interconnection comprised of a metal in said opening in said layer of dielectric material comprises forming a conductive interconnection comprised of at least one of copper, aluminum and tungsten in said opening in said layer of dielectric material.

27. The method of claim 21, wherein forming a conductive interconnection comprised of a metal in said opening in said layer of dielectric material comprises depositing a metal in said opening in said layer of dielectric material and planarizing said metal.

28. A method, comprising:

depositing a layer of dielectric material, said layer of dielectric material having an upper surface;

depositing a hard mask layer comprised of silicon nitride above said upper surface of said layer of dielectric material, said hard mask layer having a thickness ranging from approximately 500–2000 Å;

etching an opening in said hard mask layer to thereby expose a portion of said upper surface of said layer of dielectric material;

depositing a layer of silicon nitride above said hard mask layer and in said opening;

performing an anisotropic etching process to define a sidewall spacer comprised of silicon nitride in said opening above said exposed upper surface of said layer of dielectric material, said sidewall spacer defining a reduced opening;

etching an opening in said layer of dielectric material below said reduced opening; and forming a conductive interconnection comprised of a metal in said opening in said layer of dielectric material.

* * * * *